US012581715B2

(12) United States Patent
Yang et al.

(10) Patent No.: US 12,581,715 B2
(45) Date of Patent: Mar. 17, 2026

(54) SEMICONDUCTOR DEVICE AND A METHOD OF FABRICATING THE SAME WITH INCREASED EFFECTIVE WIDTH OF THE CHANNEL WITHOUT INCREASING THE WIDTH OF THE GATE ACTIVE REGION

(71) Applicant: MACRONIX International Co., Ltd., Hsinchu (TW)

(72) Inventors: I-Chen Yang, Miaoli County (TW); Chun Liang Lu, Kinmen County (TW); Yung-Hsiang Chen, Taipei City (TW); Yao-Wen Chang, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 527 days.

(21) Appl. No.: 18/153,368

(22) Filed: Jan. 12, 2023

(65) Prior Publication Data

US 2024/0243180 A1    Jul. 18, 2024

(51) Int. Cl.
    *H10D 64/27*        (2025.01)
    *H10D 30/60*        (2025.01)
        (Continued)

(52) U.S. Cl.
    CPC ......... *H10D 64/513* (2025.01); *H10D 30/601* (2025.01); *H10D 64/027* (2025.01);
        (Continued)

(58) Field of Classification Search
    CPC .. H10D 64/015; H10D 64/018; H10D 64/021; H10D 84/0147; H10D 84/0184;
        (Continued)

(56) References Cited

U.S. PATENT DOCUMENTS 5,021,354 A * 6/1991 Pfiester .............. H10D 84/0184
                                    257/E21.197
5,932,911 A * 8/1999 Yue ...................... H10D 30/024
                                    257/E21.429

(Continued)

FOREIGN PATENT DOCUMENTS

CN          115497951          12/2022
TW          201719760          6/2017

OTHER PUBLICATIONS

"Office Action of Taiwan Counterpart Application", issued on May 10, 2024, pp. 1-7.

*Primary Examiner* — Maliheh Malek
(74) *Attorney, Agent, or Firm* — J.C. PATENTS

(57)                ABSTRACT

A semiconductor device includes a substrate, a gate structure, a first doped region and a second doped region. The substrate has a plurality of recesses therein. A gate structure covers the plurality of recesses and a surface of the substrate between the plurality of recesses. The gate structure includes a gate dielectric layer and a gate conductive layer. The gate dielectric layer covers bottom surfaces and sidewalls of the plurality of recesses and the surface of the substrate between the plurality of recesses. The gate conductive layer is formed on the gate dielectric layer, fills in the plurality of recesses and covers the surface of the substrate between the plurality of recesses. The first doped region and the second doped region are located at two sides of the gate structure.

12 Claims, 14 Drawing Sheets

(51) Int. Cl.
    *H10D 64/01*       (2025.01)
    *H10D 84/01*       (2025.01)
    *H10D 30/01*       (2025.01)

(52) U.S. Cl.
    CPC ........ *H10D 64/519* (2025.01); *H10D 30/0229*
    (2025.01); *H10D 64/018* (2025.01); *H10D*
    *84/0147* (2025.01)

(58) Field of Classification Search
    CPC .......... H10D 30/0285; H10D 30/0293; H10D
    64/675–679; H10D 64/68–693; H10D
    84/40–409; H10D 84/80–859; H10D
    84/0109; H10D 84/0123–0195; H10D
    64/027; H10D 64/513; H01L
    21/28132–2815
    See application file for complete search history.

(56)               References Cited

U.S. PATENT DOCUMENTS

| | | | | |
|---|---|---|---|---|
| 6,319,777 | B1 * | 11/2001 | Hueting | H10D 30/668 |
| | | | | 438/270 |
| 6,642,130 | B2 * | 11/2003 | Park | H10D 30/0212 |
| | | | | 257/E21.429 |
| 6,930,030 | B2 * | 8/2005 | Rausch | H01L 21/3065 |
| | | | | 257/E29.267 |
| 7,148,527 | B2 * | 12/2006 | Kim | H10D 30/601 |
| | | | | 257/E21.429 |
| 7,442,607 | B2 * | 10/2008 | Kim | H10D 64/027 |
| | | | | 257/E21.429 |
| 7,541,656 | B2 * | 6/2009 | Kim | H10D 64/018 |
| | | | | 438/243 |
| 7,586,150 | B2 * | 9/2009 | Jang | H10D 30/608 |
| | | | | 257/314 |
| 7,635,620 | B2 * | 12/2009 | Chen | H10D 30/792 |
| | | | | 257/288 |
| 7,804,130 | B1 * | 9/2010 | Fung | H10D 64/691 |
| | | | | 257/330 |
| 8,089,123 | B2 * | 1/2012 | Venkatesan | H10D 30/024 |
| | | | | 257/E29.345 |
| 8,497,184 | B2 * | 7/2013 | Ozawa | H10B 41/30 |
| | | | | 257/E21.546 |
| 8,664,722 | B2 * | 3/2014 | Shingu | H10D 30/6743 |
| | | | | 257/351 |
| 8,716,142 | B2 * | 5/2014 | Hashitani | H10D 30/0223 |
| | | | | 438/296 |
| 9,978,861 | B2 * | 5/2018 | Lao | H10D 30/658 |
| 11,031,509 | B1 * | 6/2021 | Ting | H10D 64/017 |
| 12,119,035 | B2 * | 10/2024 | Lin | H10B 53/30 |
| 12,369,364 | B1 * | 7/2025 | Kai | H10D 30/665 |
| 2002/0003257 | A1 * | 1/2002 | Fu | H10D 30/026 |
| | | | | 257/E21.429 |
| 2002/0089019 | A1 * | 7/2002 | Fu | H10D 84/016 |
| | | | | 257/E21.619 |
| 2004/0129959 | A1 * | 7/2004 | Kim | H10D 64/671 |
| | | | | 257/E21.429 |
| 2004/0248348 | A1 * | 12/2004 | Rausch | H01L 21/3065 |
| | | | | 257/E21.429 |
| 2005/0090066 | A1 * | 4/2005 | Zhu | H10D 86/201 |
| | | | | 257/E21.429 |
| 2005/0112817 | A1 * | 5/2005 | Cheng | H10D 62/021 |
| | | | | 257/374 |
| 2005/0142823 | A1 * | 6/2005 | Cho | H10D 64/027 |
| | | | | 257/E21.429 |
| 2007/0155148 | A1 * | 7/2007 | Kim | H10D 30/6211 |
| | | | | 438/585 |
| 2007/0170522 | A1 * | 7/2007 | Lee | H10D 84/038 |
| | | | | 257/E21.429 |
| 2008/0003753 | A1 * | 1/2008 | Seo | H10D 64/027 |
| | | | | 257/E21.429 |
| 2008/0128799 | A1 * | 6/2008 | Park | H01L 21/28114 |
| | | | | 257/330 |
| 2008/0157194 | A1 * | 7/2008 | Lee | H10D 84/038 |
| | | | | 257/E21.429 |
| 2009/0224311 | A1 * | 9/2009 | Hashitani | H10D 64/513 |
| | | | | 438/270 |
| 2010/0025750 | A1 * | 2/2010 | Chan | H10B 41/30 |
| | | | | 438/257 |
| 2011/0065275 | A1 * | 3/2011 | Kim | H10B 12/485 |
| | | | | 257/E21.585 |
| 2011/0278662 | A1 * | 11/2011 | Park | H10D 64/519 |
| | | | | 257/330 |
| 2012/0056241 | A1 * | 3/2012 | Sumitomo | H10D 12/481 |
| | | | | 257/E21.384 |
| 2012/0273795 | A1 * | 11/2012 | Li | H10D 64/513 |
| | | | | 257/E29.089 |
| 2013/0240996 | A1 * | 9/2013 | Yin | H10D 84/038 |
| | | | | 257/E27.06 |
| 2013/0313637 | A1 * | 11/2013 | Yoshida | H10D 84/038 |
| | | | | 257/334 |
| 2014/0008664 | A1 * | 1/2014 | Kudou | H10D 30/025 |
| | | | | 257/77 |
| 2015/0318365 | A1 * | 11/2015 | Cheng | H10D 64/027 |
| | | | | 257/330 |
| 2016/0064390 | A1 * | 3/2016 | Choi | H10B 20/25 |
| | | | | 257/314 |
| 2016/0163789 | A1 * | 6/2016 | Hsieh | H10D 64/519 |
| | | | | 257/330 |
| 2016/0268434 | A1 * | 9/2016 | Ching | H10D 62/151 |
| 2017/0352744 | A1 * | 12/2017 | Basker | H10D 64/512 |
| 2018/0151693 | A1 * | 5/2018 | Li | H10D 30/024 |
| 2019/0088769 | A1 * | 3/2019 | Matsushita | H10D 84/817 |
| 2019/0103284 | A1 * | 4/2019 | Yu | H10D 84/013 |
| 2020/0043794 | A1 * | 2/2020 | Su | H10D 30/0243 |
| 2020/0058748 | A1 * | 2/2020 | Bae | H10D 64/015 |
| 2020/0373392 | A1 * | 11/2020 | Hiyoshi | H10D 62/107 |
| 2021/0035983 | A1 * | 2/2021 | Song | H10B 12/482 |
| 2022/0102528 | A1 * | 3/2022 | Kim | H10B 12/315 |
| 2022/0108982 | A1 * | 4/2022 | Hwang | H10D 84/013 |
| 2022/0181329 | A1 * | 6/2022 | Choi | H10B 12/50 |
| 2022/0189870 | A1 * | 6/2022 | Shin | H01L 21/76831 |
| 2022/0262803 | A1 * | 8/2022 | Jang | H10B 12/053 |
| 2022/0310814 | A1 * | 9/2022 | Hsiung | H10D 64/518 |
| 2022/0359718 | A1 * | 11/2022 | Han | H01L 21/31144 |
| 2023/0043936 | A1 * | 2/2023 | Park | H10B 12/34 |
| 2023/0079098 | A1 * | 3/2023 | Togo | H10D 64/513 |
| | | | | 257/345 |
| 2023/0083560 | A1 * | 3/2023 | Togo | H10D 84/0142 |
| | | | | 257/330 |
| 2023/0327002 | A1 * | 10/2023 | Chen | H10D 64/666 |
| | | | | 438/197 |
| 2023/0402457 | A1 * | 12/2023 | Lu | H10D 84/0188 |
| 2024/0038265 | A1 * | 2/2024 | Lin | H10D 1/682 |
| 2024/0204072 | A1 * | 6/2024 | Tsai | H10D 30/611 |
| 2024/0312843 | A1 * | 9/2024 | Lin | H10D 84/0151 |
| 2024/0387327 | A1 * | 11/2024 | Chen | H10D 62/121 |
| 2025/0046707 | A1 * | 2/2025 | Mun | H10B 12/315 |
| 2025/0081591 | A1 * | 3/2025 | Chuang | H10D 64/512 |
| 2025/0126841 | A1 * | 4/2025 | Lin | H10D 30/797 |
| 2025/0203967 | A1 * | 6/2025 | Chen | H10D 30/43 |
| 2025/0203991 | A1 * | 6/2025 | Li | H10D 30/6735 |
| 2025/0227994 | A1 * | 7/2025 | Hsu | H10D 30/024 |

* cited by examiner

SEMICONDUCTOR DEVICE AND A METHOD OF FABRICATING THE SAME WITH INCREASED EFFECTIVE WIDTH OF THE CHANNEL WITHOUT INCREASING THE WIDTH OF THE GATE ACTIVE REGION

BACKGROUND

Technical Field

The present disclosure relates to an integrated circuit and a method of fabricating the same, and particularly to a semiconductor device and a method of fabricating the same.

Description of Related Art

In recent years, with the development of semiconductor technology, the size of an electronic device has become smaller, and the size of a gate structure has become smaller. However, as the size of gate structure has become smaller, less current passeses through the channel below the gate structure, and thus the performance of the device is decreased. In order to maintain or improve the performance of the device, the size of the device cannot be effectively reduced, so a larger chip area must be occupied.

SUMMARY

The disclosure provides a semiconductor device and a method of fabricating the same, in which the effective width of the channel between the source and the drain can be increased without increasing the width of the gate active region.

According to an embodiment of the present disclosure, a semiconductor device includes a substrate, a gate structure, a first doped region and a second doped region. The substrate has a plurality of recesses therein. The gate structure covers the plurality of recesses and the substrate surface between the plurality of recesses. The gate structure includes a gate dielectric layer and a gate conductive layer. The gate dielectric layer covers the bottom surfaces and sidewalls of the plurality of recesses and the surface of the substrate between the plurality of recesses. The gate conductive layer is disposed on the gate dielectric layer, fills in the plurality of recesses and covers the surface of the substrate between the plurality of recesses. The first doped region and the second doped region are located at two sides of the gate structure.

According to an embodiment of the present disclosure, a method of fabricating a semiconductor device includes the following steps. A plurality of recesses are formed in the substrate. A gate structure is formed on the substrate, wherein the gate structure covers the plurality of recesses and the surface of the substrate between the plurality of recesses and the surface. The gate structure includes a gate dielectric layer and a gate conductive layer. The gate dielectric layer covers the bottom surfaces and the sidewalls of the plurality of recesses and the surface of the substrate between the plurality of recesses. A gate conductive layer is formed on the gate dielectric layer, fills in the plurality of recesses and covers the surface of the substrate between the plurality of recesses. A first doped region and a second doped region are formed at two sides of the gate structure.

The arrangement of multiple recesses in the embodiment of the present disclosure can increase the formation of sidewall channels, so the effective width of the channel can be increased without increasing the width of the gate active region, and the current $I_{on}$-$I_{off}$ of the device can be increased. Therefore, the present disclosure can save the chip area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

FIG. 3A to FIG. 3D and FIG. 4A to FIG. 4D are cross-sectional views of semiconductor devices of some embodiments taken along the lines II-II' of FIG. 1A or FIG. 2A.

DESCRIPTION OF THE EMBODIMENTS

Figure 1A:
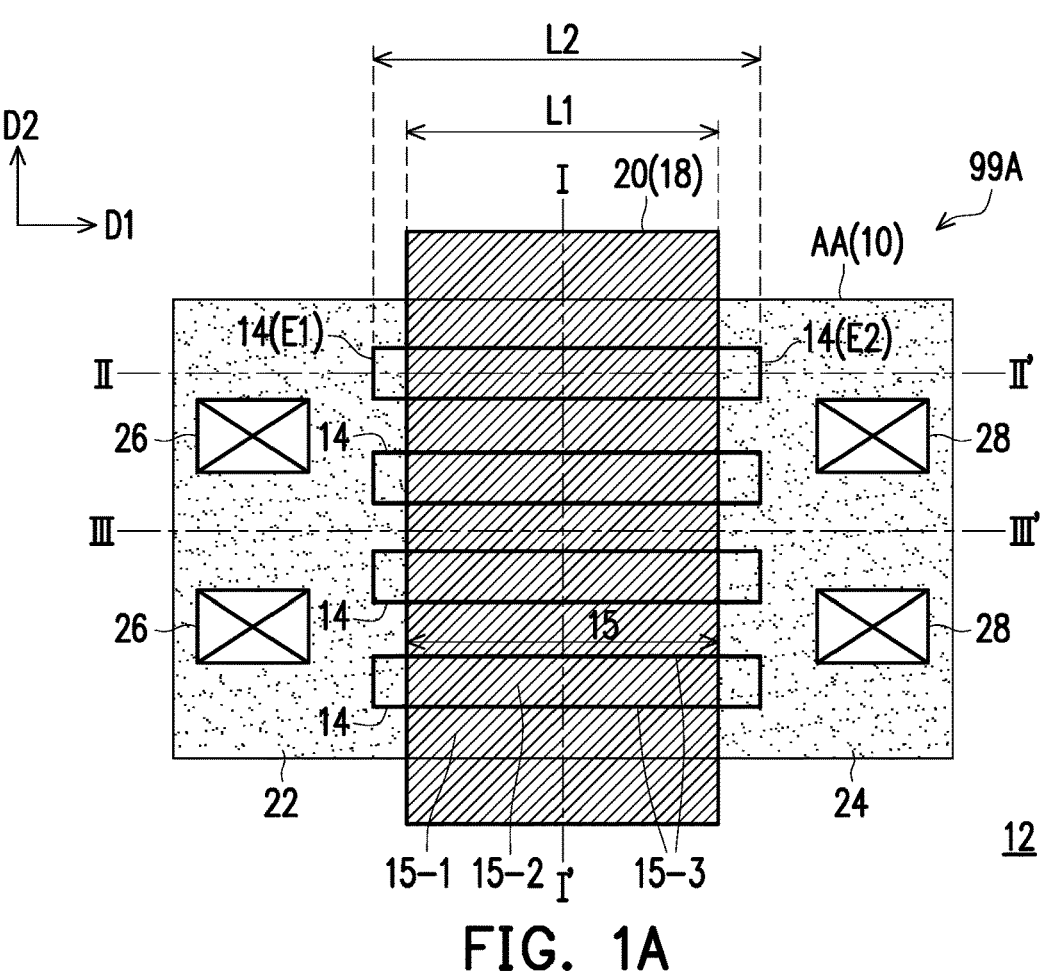
FIG. 1A and FIG. 2A are top views of semiconductor devices according to some embodiments of the present disclosure.
Figure 1B:
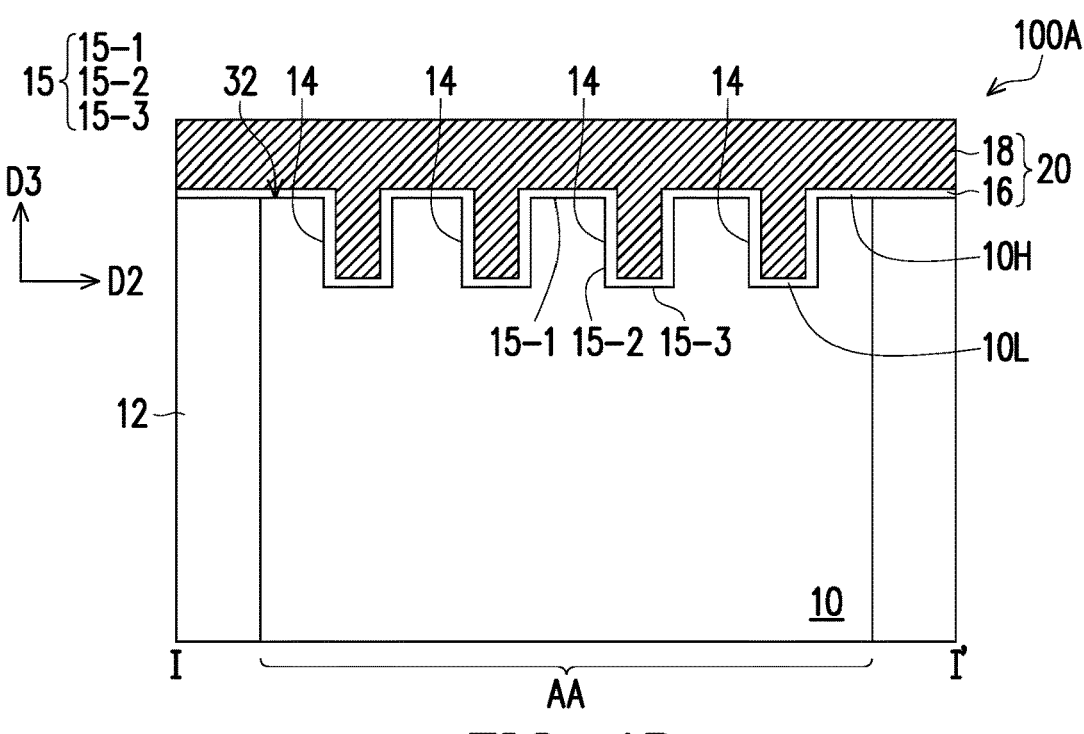
FIG. 1B and FIG. 1C are cross-sectional views of semiconductor devices of some embodiments taken along the lines I-I' of FIG. 1A.
Figure 1C:
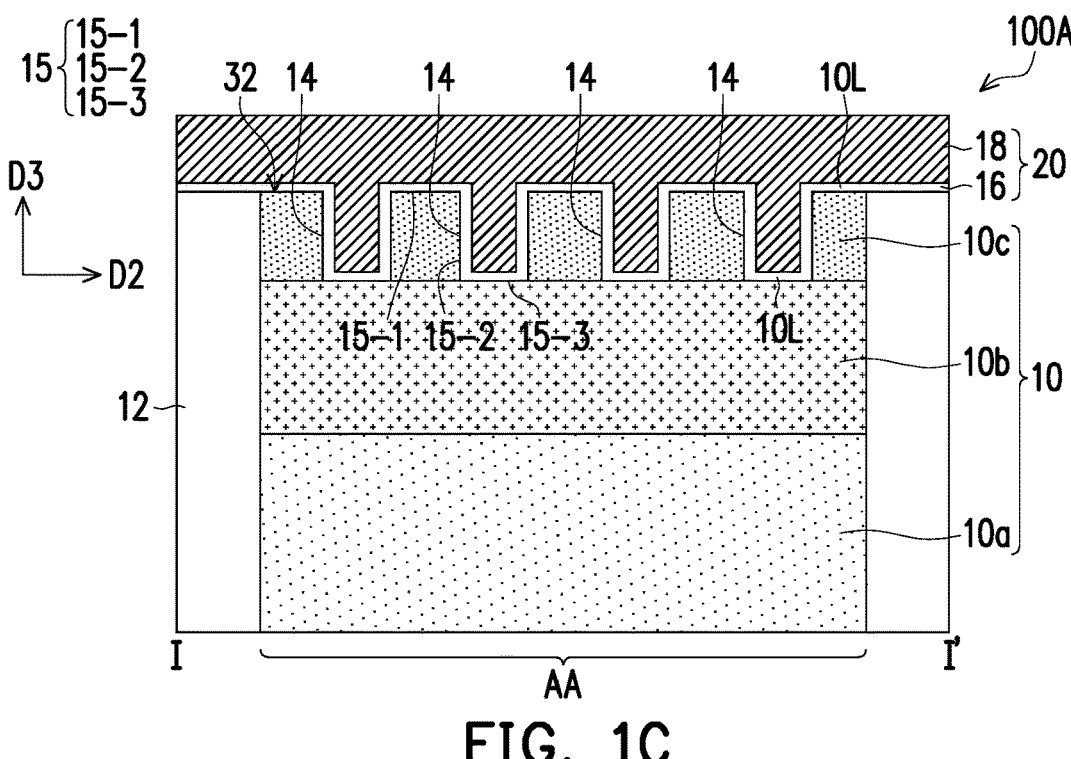
Figure 2A:
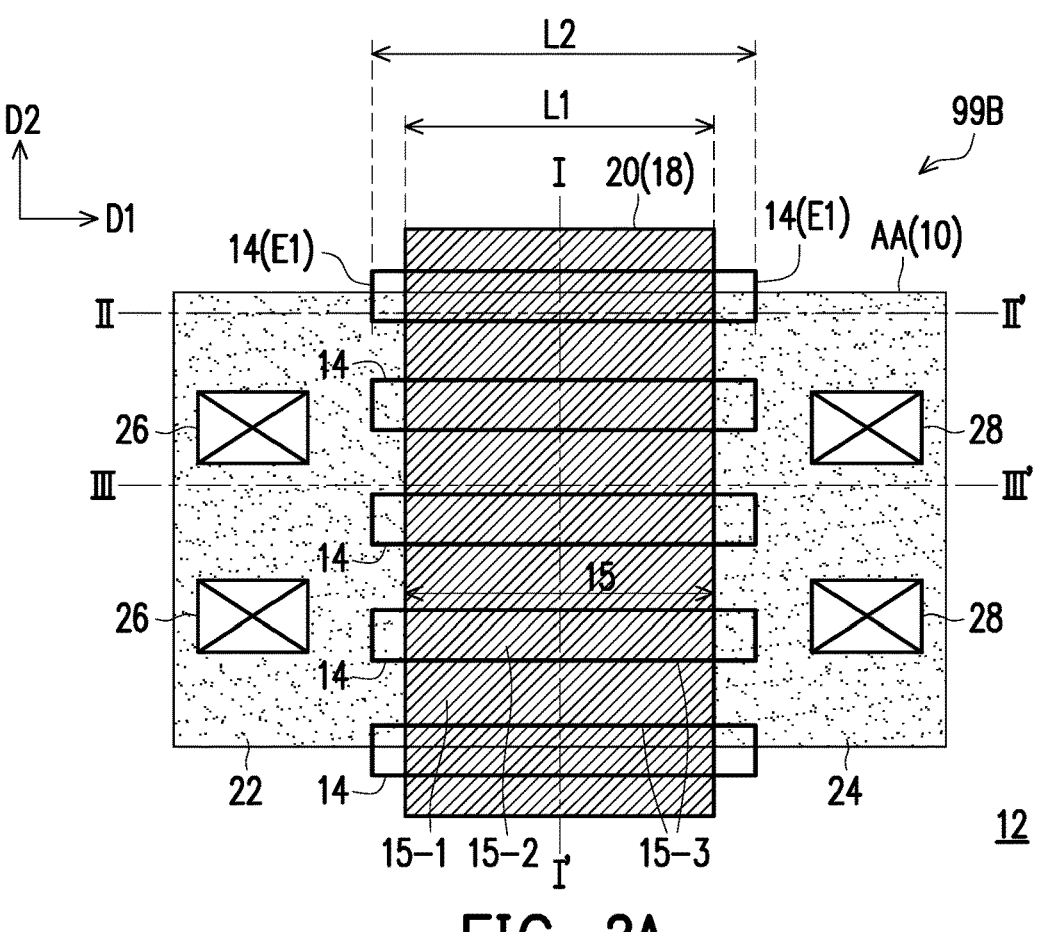
Figure 2B:
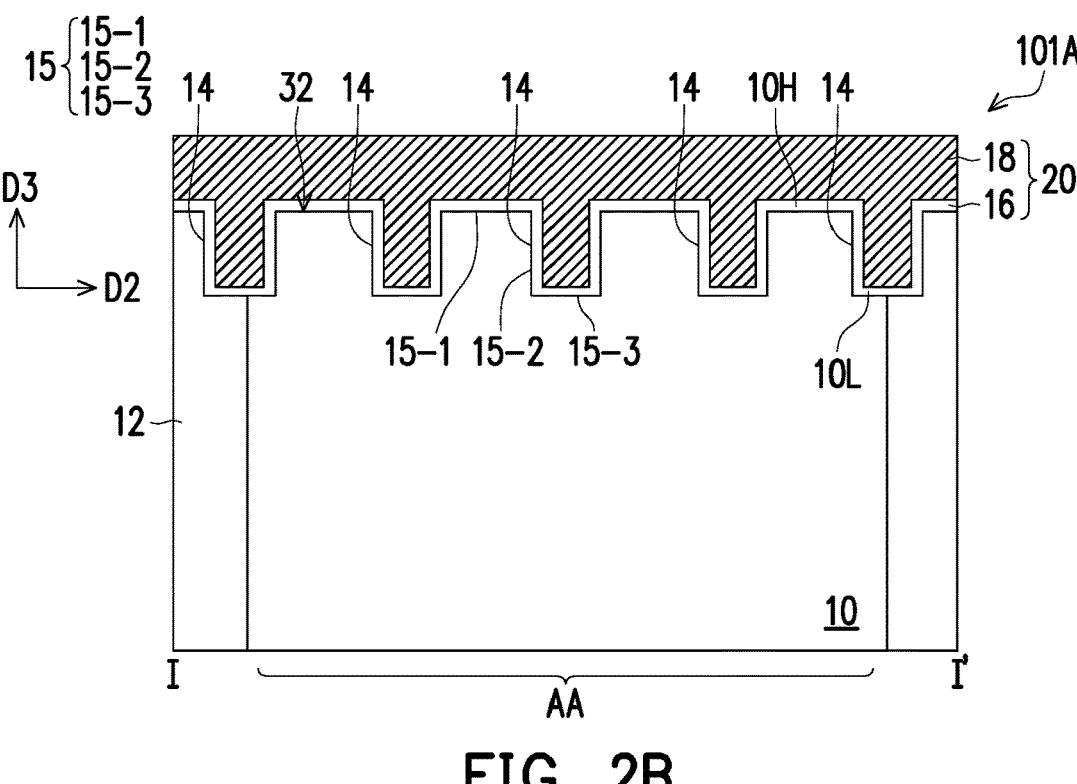
FIG. 2B and FIG. 2C are cross-sectional views of semiconductor devices of some embodiments taken along the line I-I' of FIG. 2A.
Figure 2C:
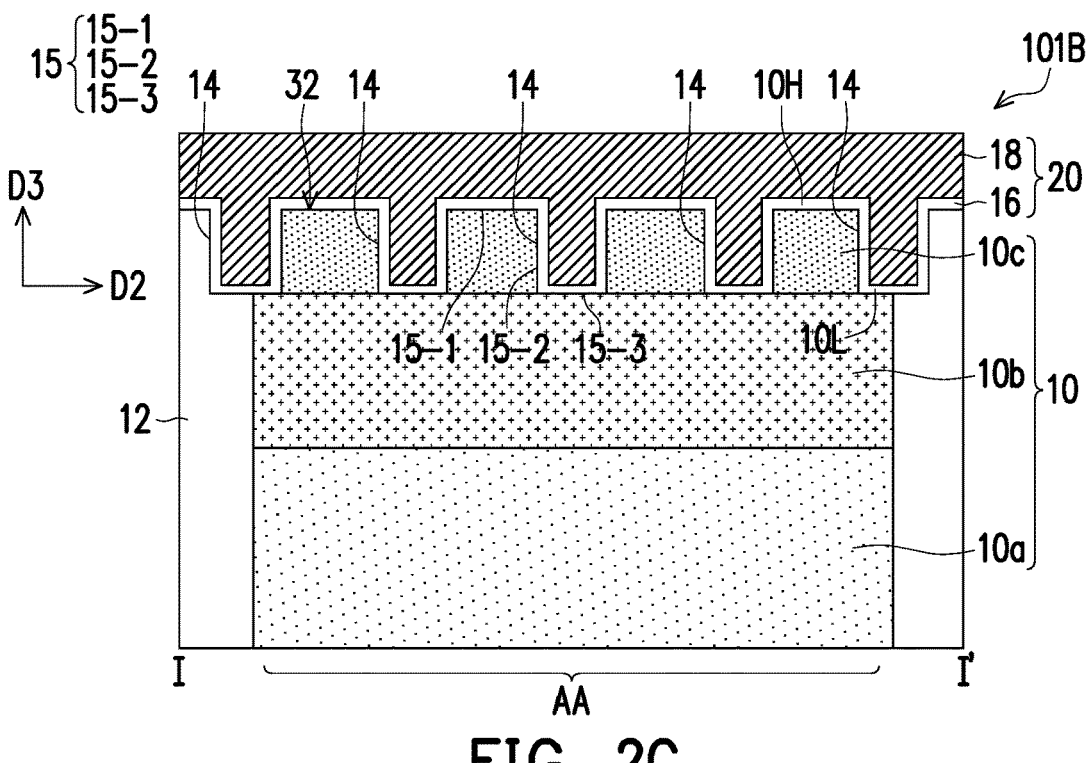

FIG. 1A and FIG. 2A are top views of semiconductor devices according to some embodiments of the present disclosure. FIG. 1B and FIG. 1C are cross-sectional views of semiconductor devices of some embodiments taken along the lines I-I' of FIG. 1A. FIG. 2B and FIG. 2C are cross-sectional views of semiconductor devices of some embodiments taken along the line I-I' of FIG. 2A.

Referring to FIG. 1A and FIG. 2A, semiconductor devices 99A and 99B of the present disclosure respectively include a substrate 10, an isolation structure 12, a gate structure 20, a first doped region 22 and a second doped region 24.

The isolation structure 12 is formed in the substrate 10 to define an active region AA. The gate structure 20 is located in the active region AA of the substrate 10 and extends onto the isolation structure 12. The first doped region 22 and the second doped region 24 are located in the active region AA of the substrate 10 at two sides of the gate structure 20. The gate structure 20, the first dope region 24 and the second doped region 24 form a single transistor. A transistor channel 15 is below the gate structure 20 and between the first doped region 22 and the second doped region 24. In other words, the channel 15 extends in a first direction D1, and the gate structure 20 extends in a second direction D2 different from the first direction D1. For example, the first direction D1 and the second direction D2 are perpendicular to each other. The direction in which the recesses 14 extend is parallel to the direction of the channel 15, and the direction in which the recesses 14 are arranged is parallel to the extending direction of the gate structure 20. In some embodiments, the semiconductor device 99A of the present disclosure further includes first contacts 26 and second contacts 28, which are respectively landed on the first doped region 22 and the second doped region 24, and are respectively electrically connected to the first doped region 22 and the second doped region 24.

The single transistor of some embodiments of the present disclosure has multiple recesses 14 in the substrate 10. The recesses 14 extend along the first direction D1 and are arranged along the second direction D2. The recesses 14 are located between the first doped region 22 and the second doped region 24. The recesses 14 and the surface of the substrate 10 between the recesses 14 are partially covered by the gate structure 20. In other words, the extending direction of each recess 14 is parallel to the extending direction of the channel 15. The length L2 of the recesses 14 in the first direction D1 is greater than the length L1 of the gate structure 20 in the first direction D1, so that two ends E1 and E2 of each recess 14 are not covered by (or exposed by) the gate conductive layer 18 of the gate structure 20.

Referring to FIG. 1A, in some embodiments, the recesses 14 of the semiconductor device 99A are formed in the active region AA. Referring to FIG. 2A, in other embodiments, the inner recesses 14 of the semiconductor device 99B are formed in the active region AA, and the outermost recess 14 are formed in both the active region AA and the isolation structure 12.

Referring to FIG. 1A and FIG. 2A, the substrate 10 of the present disclosure can be a bulk substrate (e.g., a bulk silicon substrate), a semiconductor-on-insulator substrate (e.g., a silicon-on-insulator substrate), or an advanced material that can provide compressive stress to the channel, or another III-V material such as GaAs. The substrate 10 of the present disclosure may be a bulk substrate, such as the substrate 10 of each of the semiconductor devices 100A and 101A, as shown in FIG. 1B and FIG. 2B. The bulk substrate is a bulk semiconductor substrate, for example. The substrate 10 of the present disclosure may also be a bulk substrate including a well region 10*a*, a doped region 10*b*, and a doped region 10*c*, as shown in the substrate 10 of each of the semiconductor devices 100B and 101B, as shown in FIG. 1C and FIG. 2C. The doped region 10*b* is located between the well region 10*a* and the doped region 10*c*. The doped region 10*c* may serve as a threshold voltage adjustment layer for the channel 15 close to the gate structure 20. The doped region 10*b* may serve as a threshold voltage adjustment layer for the channel 15 of a bottom parasitic device. The doped region 10*b* and the doped region 10*c* may have dopants of the same conductivity type. The conductivity type of the dopants in the well region 10 may be the same as or different from the conductivity type of the dopants in the doped region 10*b* and the doped region 10*c*. In other embodiments, the substrate may also be a semiconductor-on-insulator substrate.

Referring to FIG. 1A and FIG. 2A, in the first direction D1, the recesses 14 and the surface of the substrate 10 between the recesses 14 form a concave-convex structure 32, as shown in the concave-convex structure 32 of each of the semiconductor devices 100A, 100B, 101A, 101B in FIG. 1B, FIG. 1C, FIG. 2B and FIG. 2C. In other words, there is a non-zero distance between the bottom surface 10L of each recess 14 and the surface 10H of the substrate 10. That is, each recess 14 has a non-zero depth. In some embodiments, the distance between the bottom surface 10L of the recess 14 and the surface 10H of the substrate 10 may range from about 15 nm to 100 nm, for example. In FIG. 1C and FIG. 2C, the bottom surface 10L of the recess 14 extends to the top surface of the doped region 10*b*. In other words, the depth of the recess 14 is approximately the same as the thickness of the doped region 10*c*. In some embodiments, the recess 14 has approximately the same width from the upper portion to the lower portion thereof. In other embodiments, the recess 14 has inclined sidewalls, so that the width of the upper portion is greater than the width of the lower portion of the recess 14. The inclined sidewall of the recess 14 may have single, double or multiple slopes. The cross section of the recess 14 can be, for example, U-shaped, U-shaped with a wide top and a narrow bottom, V-shaped, or bowl-shaped.

Referring to FIG. 1A, FIG. 2A, FIG. 1B, FIG. 1C, FIG. 2B and FIG. 2C, when the transistor of the embodiment of the present disclosure is operated, the current between the first doped region 22 and the second doped region 24 can flow along the surface channel 15-1 of the surface 10H of the substrate 10 between two adjacent recesses 14, along the bottom surface channels 15-3 of the bottom surfaces 10L of the recesses 14, and along the sidewall channels 15-2 of the sidewalls of the recesses 14. In this embodiment, the surface channels 15-1 of the substrate 100, the bottom surface channels 15-3 of the recesses 14, and the sidewall channels 15-2 of the recesses 14 are collectively referred to as a channel 15. Therefore, as more recesses 14 are covered by the gate structure 20 of each transistor, more sidewall channels 15-2 are provided. For example, in FIG. 1A, the gate structure 20 of each transistor covers four recesses 14, and two sidewalls of each recess 14 are within the active region AA, so eight sidewall channels 15-2 are additionally provided for the gate structure of each transistor. In FIG. 2A, the gate structure 20 of each transistor covers five recesses 14, each of the three inner recesses 14 has two sidewalls within the active region AA, and each of the two outer recesses 14 only has one sidewall within the active region AA, so eight sidewall channels 15-2 are additionally provided for each transistor. Therefore, the arrangement of multiple recesses 14 in the embodiment of the present disclosure can increase the formation of sidewall channels, and thus, the effective width of the channel 15 can be increased without increasing the width of the gate active region AA.

Referring to FIG. 1C, FIG. 2B and FIG. 2C, the gate structure 20 includes a gate dielectric layer 16 and a gate conductive layer 18 stacked in a third direction D3. The third direction D3 is perpendicular to the first direction D1 and the second direction D2. The gate dielectric layer 16 covers the bottom surfaces and sidewalls of the recesses 14 and the surface 10H of the substrate 10 between the recesses 14. The gate dielectric layer 16 does not completely fill the recesses 14. The gate dielectric layer 16 may conformally cover the bottom surface and sidewall of each of the recesses 14 and the surface 10H of the substrate 10 between two adjacent recesses 14. The gate conductive layer 18 is formed on the gate dielectric layer 16, completely fills in (or fills up) the recesses 14 and covers the surface of the substrate 10 between the recesses 14. The gate dielectric layer 16 includes silicon oxide, silicon nitride, a high dielectric constant (high-k) material or a combination thereof. The material of the gate conductive layer includes polysilicon or metal. The metal gate conductive layer 18 can be applied to a transistor having a high-k material as the gate dielectric layer 16. The metal includes tantalum or titanium nitride, but the disclosure is not limited thereto.

Referring to FIG. 1B and FIG. 1C, in an embodiment, the recesses 14 are formed in the active region AA, the surface 10H of the substrate 10 at the edge of the active region AA may be flushed with the surface of the adjacent isolation structure 12, and higher than the bottom surfaces 10L of the recesses 14.

Referring to FIG. 2B and FIG. 2C, in an embodiment, the recesses 14 are formed in the active region AA and the isolation structure 12, the bottom surface 10L of the recess 14 at the edge of the active region AA may be flushed with the surface of the adjacent isolation structure 12, and lower than the surface 10H of the substrate 10.

FIG. 3A to FIG. 3D and FIG. 4A to FIG. 4D are cross-sectional views of the semiconductor devices of some embodiments along the line II-II' of FIG. 1A or FIG. 2A.

Figure 3A:
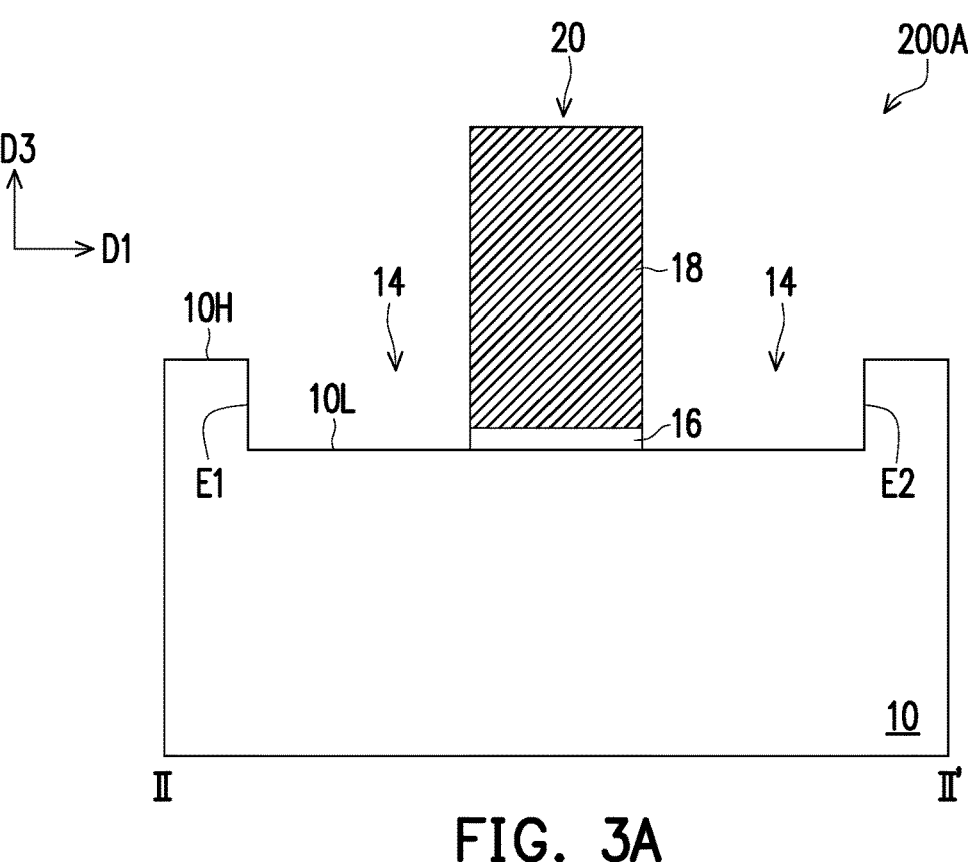
Figure 3B:
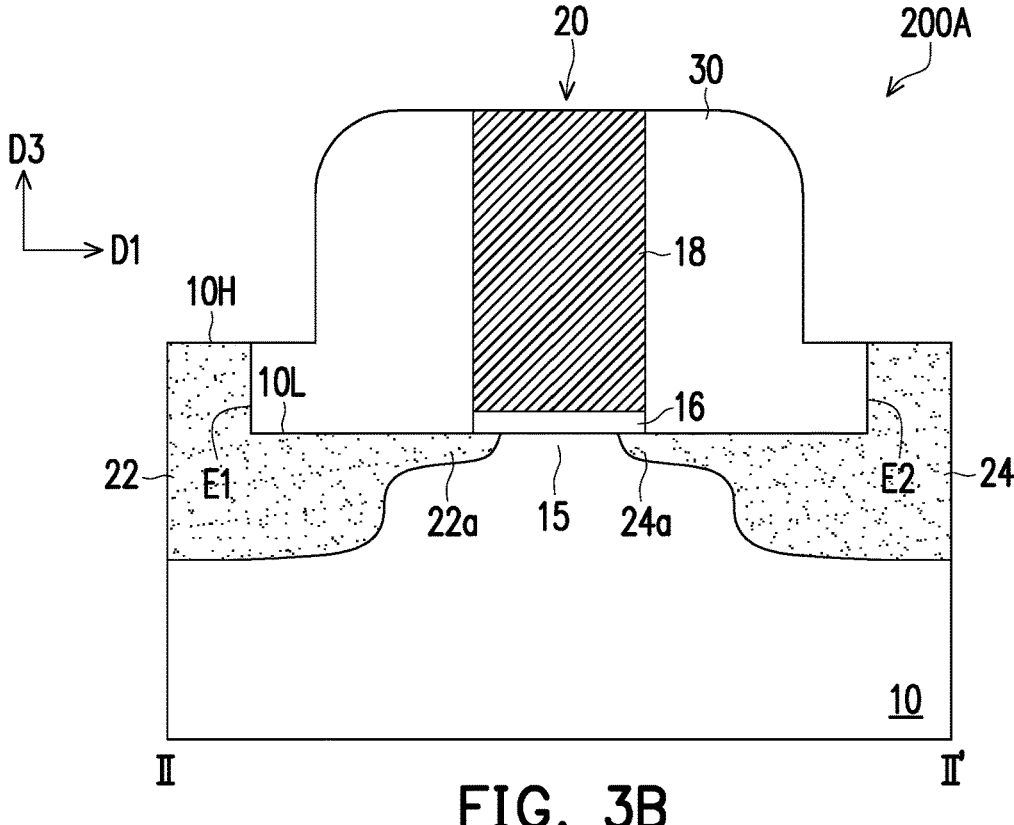
Figures 3C, 3D:
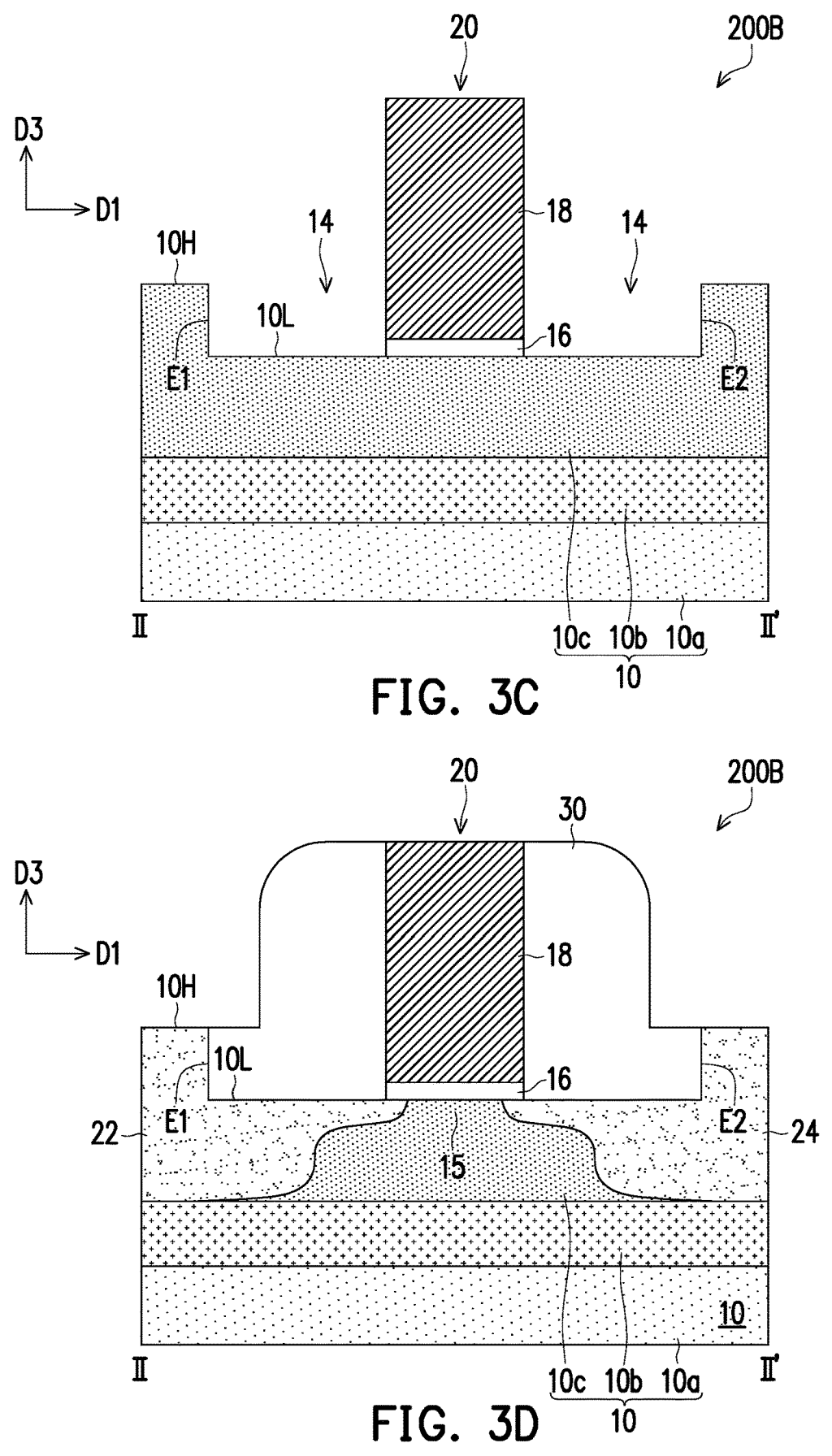
Figure 4A:
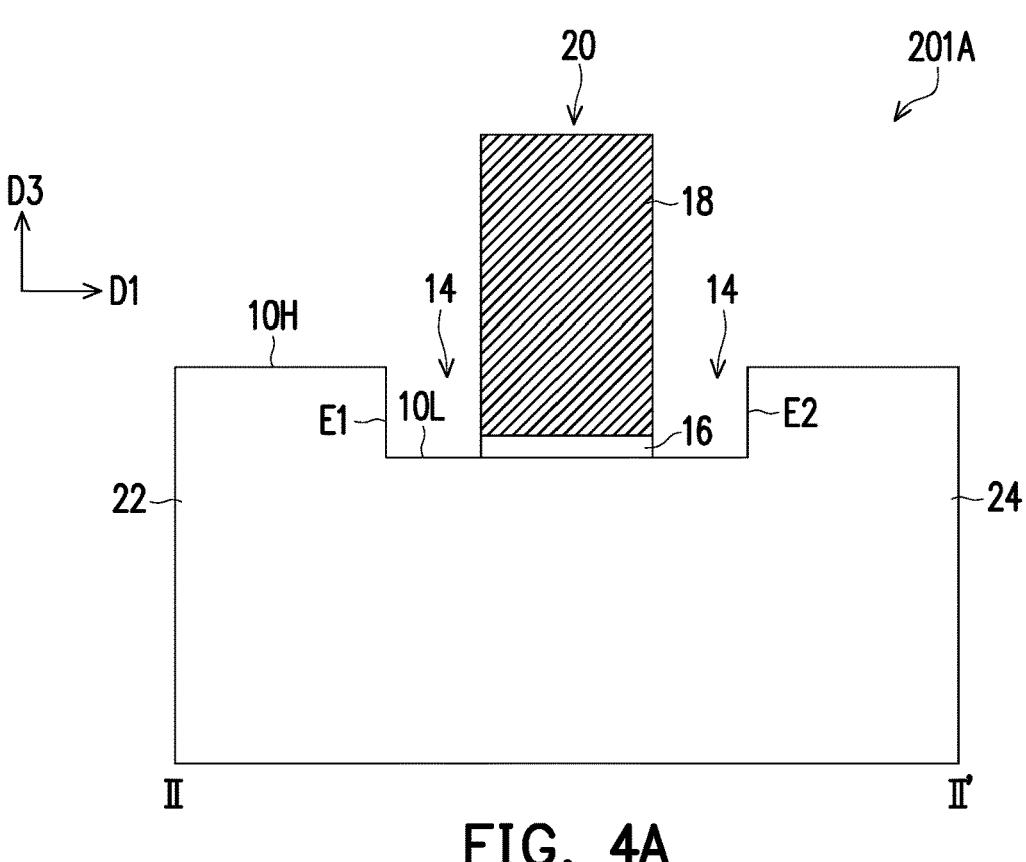
Figure 4B:
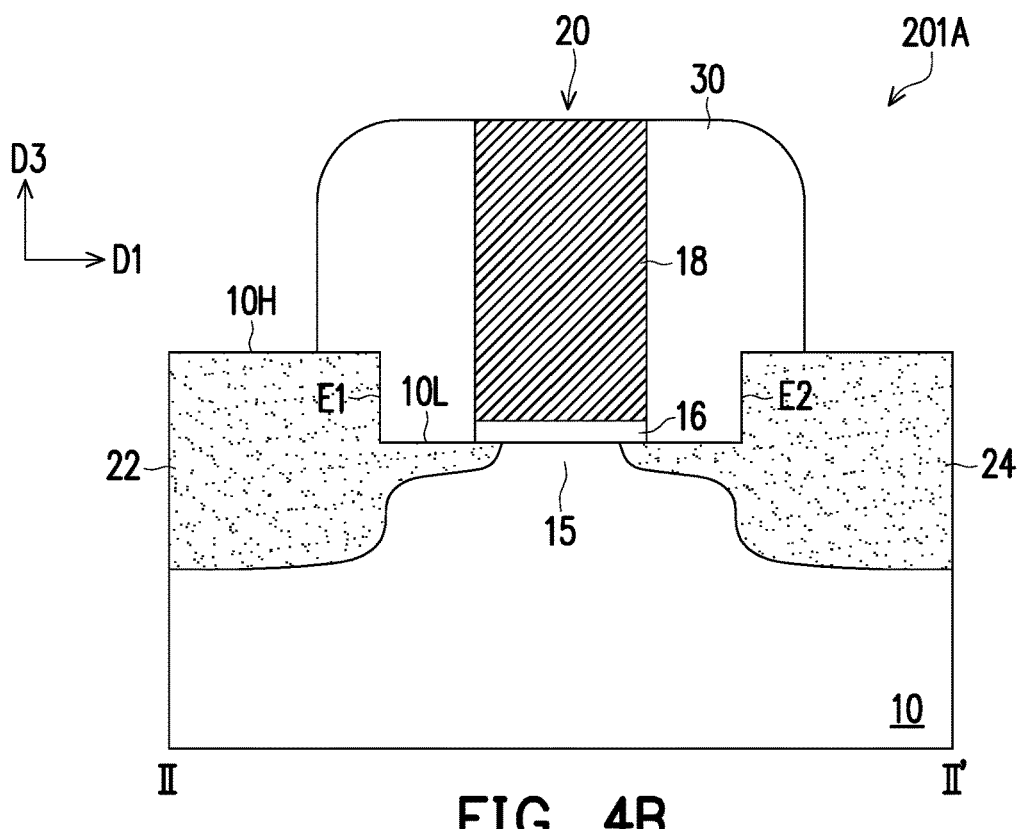

Referring to FIG. 3A, FIG. 3C, FIG. 4A and FIG. 4C, in some embodiments, the gate structure 20 of each of the semiconductor devices 200A, 200B, 201A, 201B, 300A, and 300B is formed across the recesses 14 without covering two ends E1 and E2 of each recesses 14. Referring to FIG. 3B, FIG. 3D, FIG. 4B and FIG. 4D, in some embodiments, each of the semiconductor devices 200A, 200B, 201A, 201B, 300A and 300B further includes spacers 30. The spacers 30 are formed on the sidewalls of the gate structure 20. In FIG. 3B and FIG. 3D, the spacers 30 are formed over the recess 14 and cover the sidewalls of two ends E1 and E2 of each recess 14. In FIG. 4B and FIG. 4D, the spacers 30 are formed over the recess 14, and cover the sidewalls of two ends E1 and E2 of each recess 14 and the surface 10H of the substrate 10.

FIG. 5A to FIG. 5D are cross-sectional views of semiconductor devices of some embodiments taken along line III-III' of FIG. 1A or FIG. 2A.

Referring to FIG. 5A to FIG. 5D, in some embodiments, in each of the semiconductor devices 300A and 300B, the surface 10H of the substrate 10 between the recesses 14 covered by the gate structure 20 and the spacers 30 is flushed with the surface 10H of the substrate 10 not covered by the gate structure 20.

Referring to FIG. 3A to FIG. 3D, FIG. 4A to FIG. 4D and FIG. 5A to FIG. 5D, in some embodiments, in each of the semiconductor devices 200A, 200B, 201A, 201B, 300A, and 300B, parts of the first doped region 22 and the second doped region 24 outside of the recesses 14 are raised from (or protrude from) the bottom surfaces of the recesses 14, and therefore, the parts of the first doped region 22 and the second doped region 24 outside of the recesses 14 are referred to as raised parts (or protrusions) of the first doped region 22 and the second doped region 24. In other words, the first doped region 22 and the second doped region 24 can also be referred to as the first raised doped region 22 and the second raised doped region 24. In addition, channel stress materials can be embedded in the first doped region 22 and the second doped region 24 to increase the saturation current $I_{sat}$ of the device. For example, for an NMOS transistor, silicon carbide (SiC) can be embedded in the first doped region 22 and the second doped region 24. For a PMOS transistor, silicon germanium (SiGe) can be embedded in the first doped region 22 and the second doped region 24.

Referring to FIG. 3A to FIG. 3D, FIG. 4A to FIG. 4D, and FIG. 5A to FIG. 5D, in some embodiments, each of the semiconductor devices 200A, 200B, 201A, 201B, 300A, and 300B may further include lightly doped drain regions 22a and 24a, respectively between the first doped region 22 and the gate structure 20 and between the second doped region 24 and the gate structure 20. The lightly doped drain regions 22a and 24a are referred to as lightly doped regions in some examples.

FIG. 6A to FIG. 6D are cross-sectional views of a method of fabricating a semiconductor device according to some embodiments of the present disclosure.

Figure 6A:
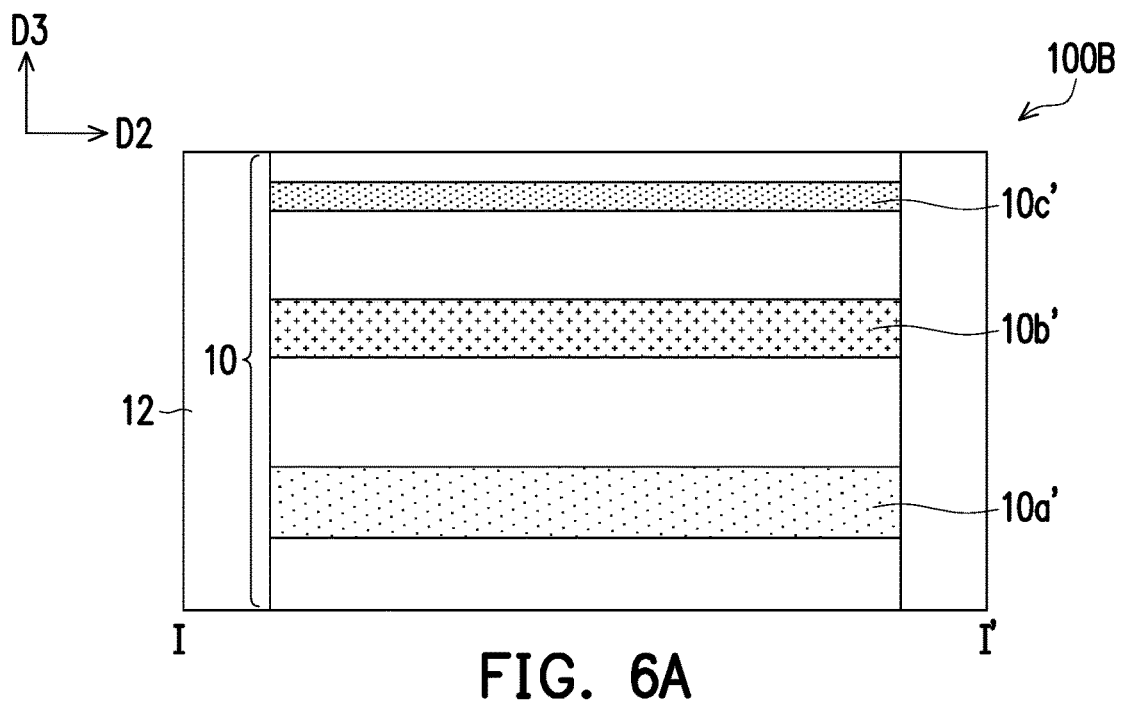
FIG. 6A to FIG. 6D are cross-sectional views of a method of fabricating a semiconductor device according to some embodiments of the present disclosure.

Referring to FIG. 6A, a substrate 10 is provided. The substrate 10 may be a semiconductor substrate, such as a silicon substrate. Next, an isolation structure 12 is formed in the substrate 10. The isolation structure 12 is a shallow trench isolation structure, for example. The material of the isolation structure 12 includes silicon oxide, silicon nitride or a combination thereof. The isolation structure 12 has sidewalls perpendicular to the surface of the substrate 10, or has inclined sidewalls.

After that, multiple ion implantation processes are performed, so as to form a well region 10a', a doped region 10b' and a doped region 10c' in the substrate 10. A sacrificial layer (not shown) may be formed on the substrate 10 before performing the ion implantation processes, and the sacrificial layer is removed after the formation of the well region 10a', the doped region 10b' and the doped region 10c'. The sacrificial layer includes screen oxide, for example.

Figure 6B:
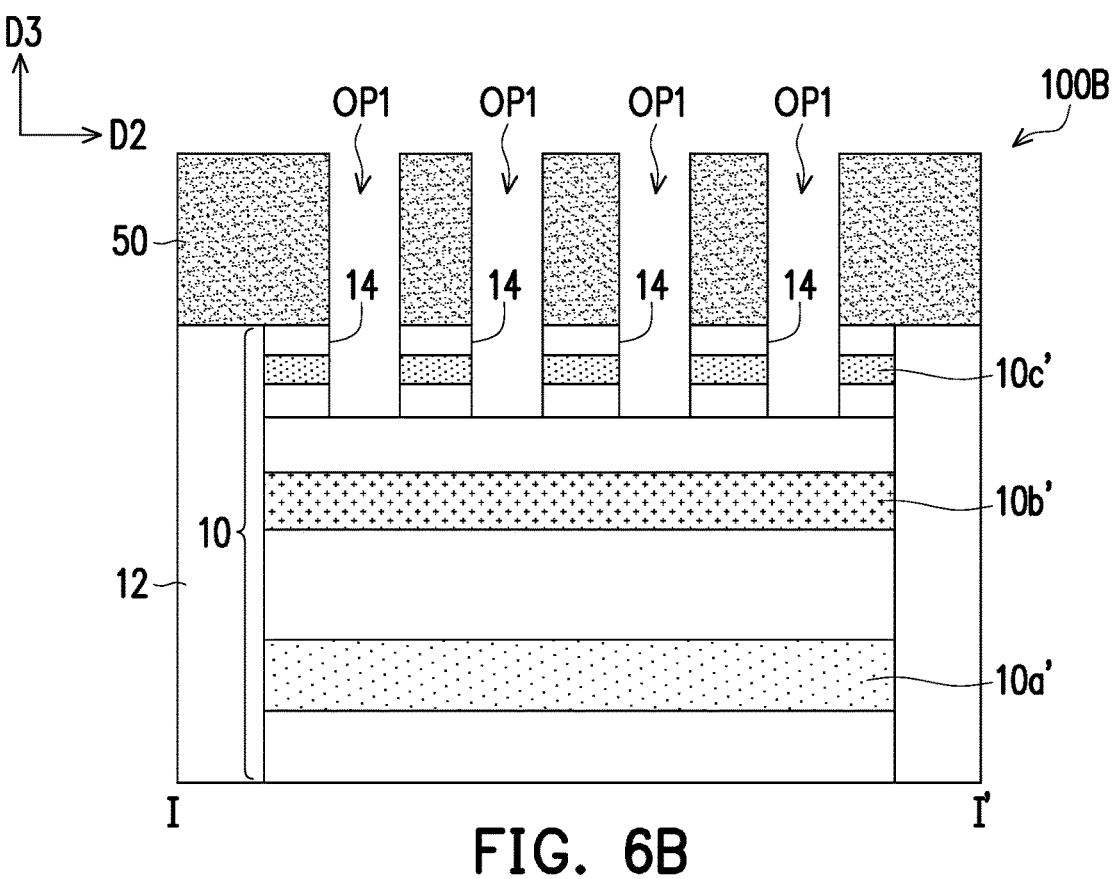

Referring to FIG. 6B, a mask layer 50 is formed over the substrate 10. The mask layer 50 is patterned through a lithography process to form multiple openings OP1. The mask layer 50 includes a photoresist layer. Next, an etching process is performed to form multiple recesses 14 in the substrate 10. The etching process for forming the recesses 14 may be a single etching process or multiple etching processes. The etching process includes an anisotropic etching process, an isotropic etching process or a combination thereof. Each recess 14 has sidewalls perpendicular to the surface of the substrate 10, e.g., having approximately the same width from the upper portion to the lower portion of the recess 14. Alternatively, the recess 14 has inclined sidewalls. For example, the width of the upper portion is greater than the width of the lower portion of the recess 14. The inclined sidewalls of the recess 14 may have single, double or multiple slopes. The cross section of the recess 14 can be, for example, U-shaped, U-shaped with a wide top and a narrow bottom, V-shaped, or bowl-shaped.

Figure 6C:
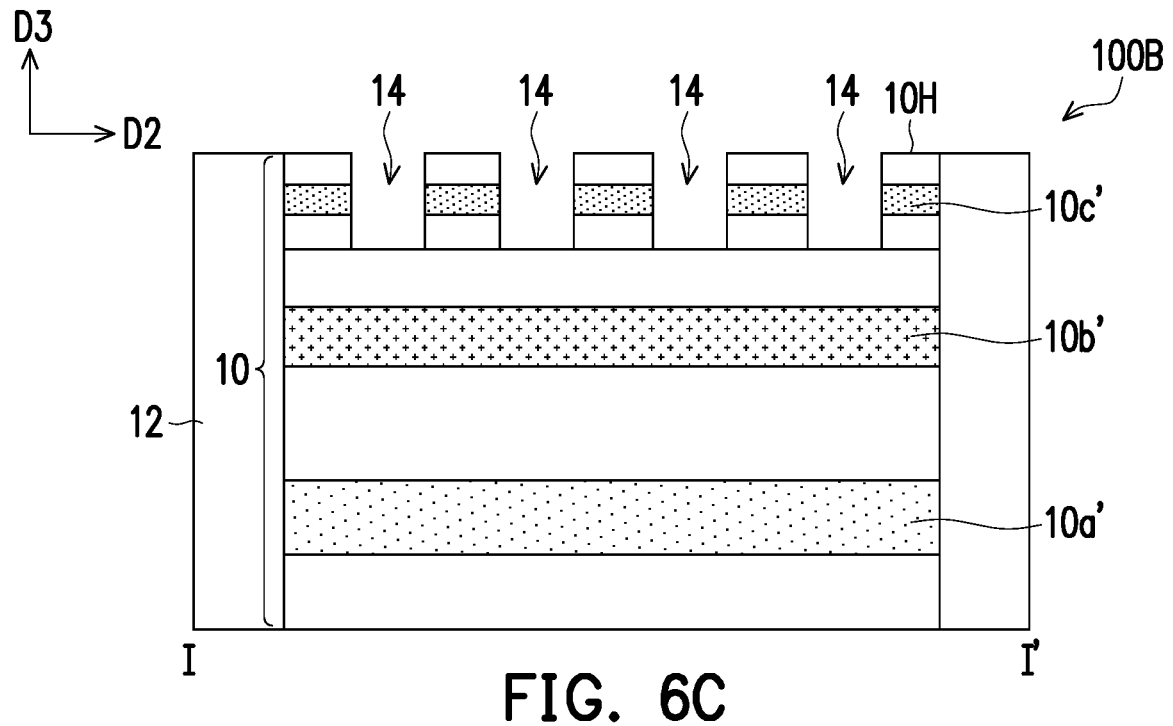
Figure 6D:
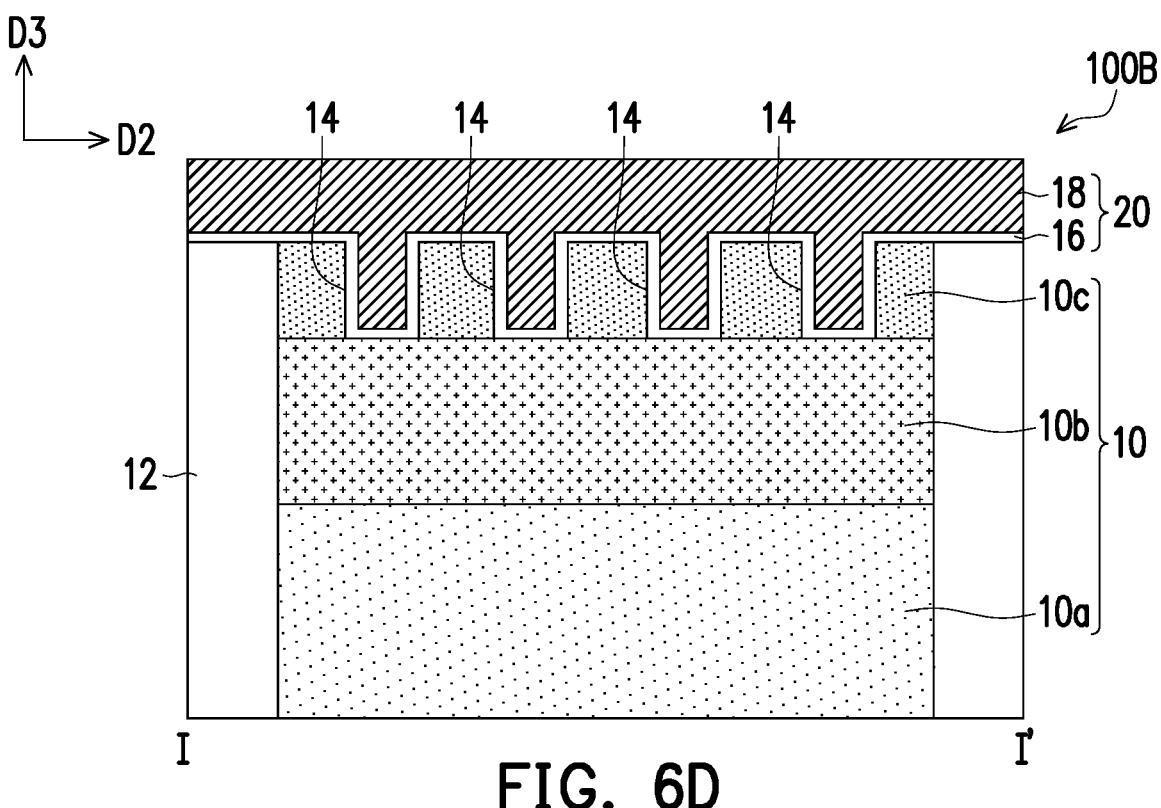

Referring to FIG. 6C, the mask layer 50 is removed to expose the surface 10H of the substrate 10 and the bottom surfaces 10L of the recesses 14. The mask layer 50 can be stripped by a dry process such as oxygen plasma, or removed by a wet process.

Referring to FIG. 6D, FIG. 3C, FIG. 4C and FIG. 5C, a gate structure 20 is formed on the substrate 10. The gate structure 20 includes a gate dielectric layer 16 and a gate conductive layer 18. The method of forming the gate dielectric layer 16 and the gate conductive layer 18 includes forming a gate dielectric material and a gate conductive material on the substrate 10, and then performing lithography etching processes to pattern the gate dielectric material and the gate conductive material. The material of the gate dielectric layer 16 includes silicon oxide, silicon nitride and a high-k material formed by, for example, a thermal oxidation process. The high-k material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$ or a combination thereof. The gate conductive layer 18 includes polysilicon, doped polysilicon, tantalum, titanium nitride or a combination thereof.

Referring to FIG. 6D, FIG. 3D, FIG. 4D and FIG. 5D, an ion implantation process is performed to form lightly doped drain regions 22a and 24a in the substrate 10 at two sides of the gate structure 20. Thereafter, spacers 30 are formed on sidewalls of the gate structure 20. Then, an ion implantation process and a thermal annealing process are performed to form a first doped region 22 and a second doped region 24 in the substrate 10. One of the first doped region 22 and the second doped region 24 is a source region. The other of the first doped region 22 and the second doped region 24 is a drain region. During the thermal oxidation process of forming the gate dielectric layer 16, the dopants in the well region 10a' and the doped regions 10b' and 10c' may be activated to form the well region 10a and the doped regions 10b and 10c. In some embodiments, after the lightly doped drain regions 22a and 24a are formed, an annealing process may be performed. During the annealing process, the dopants in the well region 10a' and the doped regions 10b' and 10c' may be activated to form the well region 10a and the doped regions 10b and 10c.

In the above embodiments, the isolation structure 12 is formed before the gate structure 20 is formed. However, in other embodiments, the isolation structure 12 may be formed after the gate dielectric material and the gate conductive material are formed, as shown in FIG. 7A to FIG. 7E.

FIG. 7A to FIG. 7E are cross-sectional views of the manufacturing process of semiconductor devices according to other embodiments of the present disclosure.

Figure 7A:
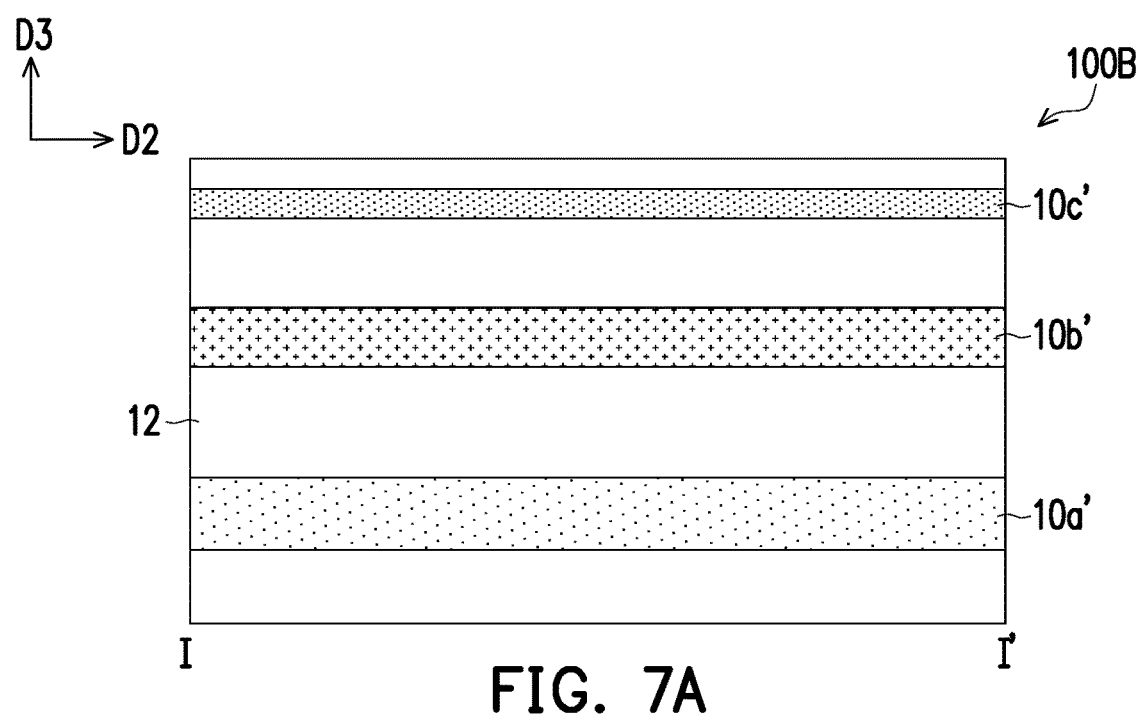
FIG. 7A to FIG. 7E are cross-sectional views of a method of fabricating a semiconductor device according to other embodiments of the present disclosure.

Referring to FIG. 7A, a well region 10a', a doped region 10b', and a doped region 10c' are formed in a substrate 10 according to the method described above. It should be noted that in this embodiment, the isolation structure 12 is not formed before the formation of the well region 10a', the doped region 10b' and the doped region 10c', but is formed later.

Figure 7B:
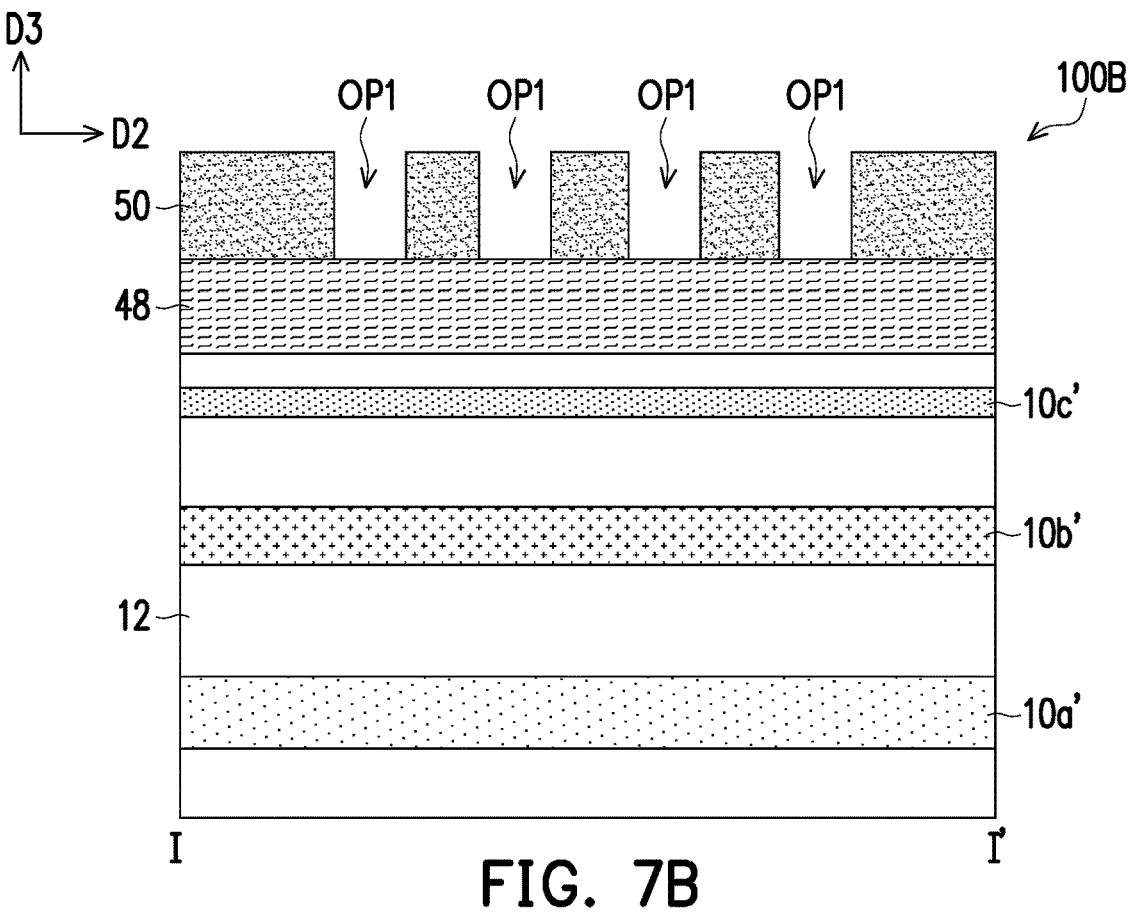

Referring to FIG. 7B, before forming a mask layer 50, a hard mask layer 48 is formed on the substrate 10. The hard mask layer 48 includes silicon nitride, silicon oxide or a combination thereof. After that, the mask layer 50 is formed on the hard mask layer 48. The mask layer 50 is patterned through a lithography process to form multiple openings OP1.

Figure 7C:
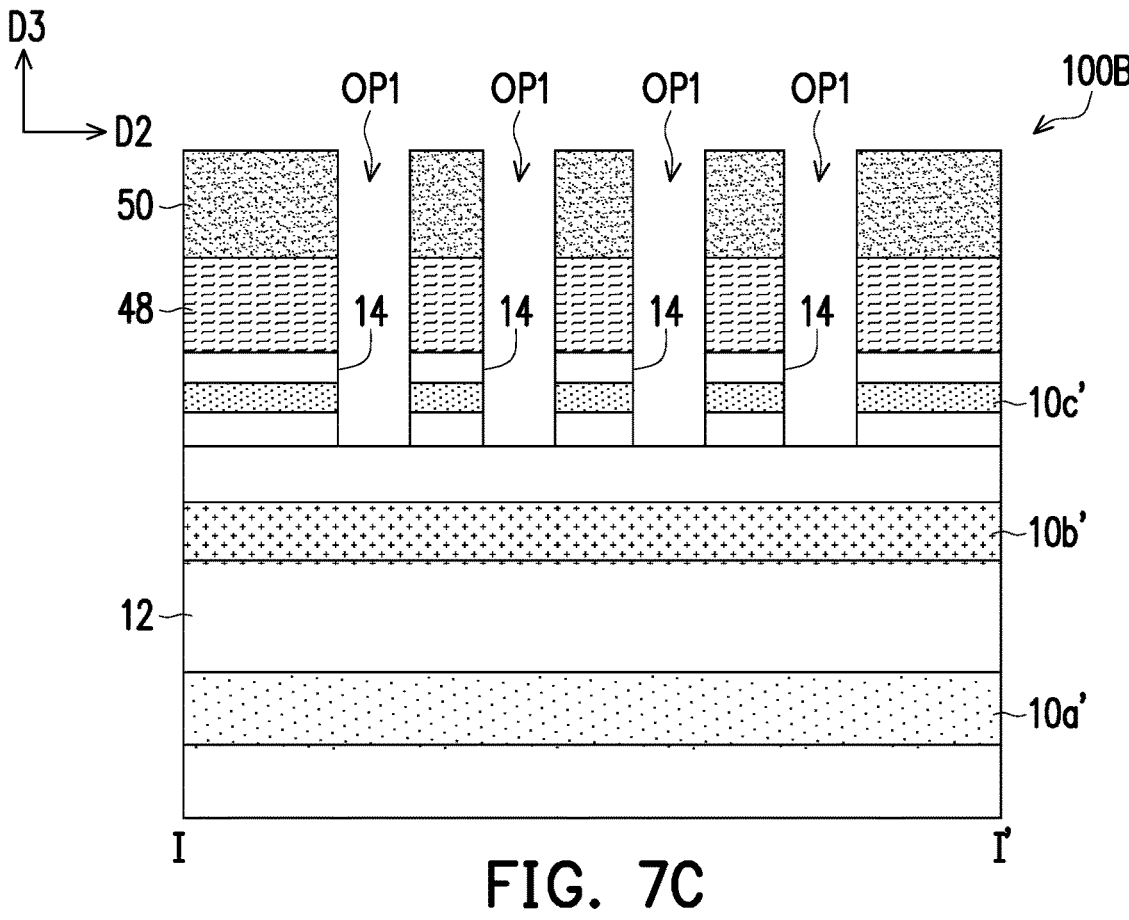

Referring to FIG. 7C, an etching process is performed to transfer patterns of the openings OP1 of the mask layer 50 to the hard mask layer 48 and then to the substrate 10, so as to form multiple recesses 14. The etching process is an anisotropic etching process, for example.

Figure 7D:
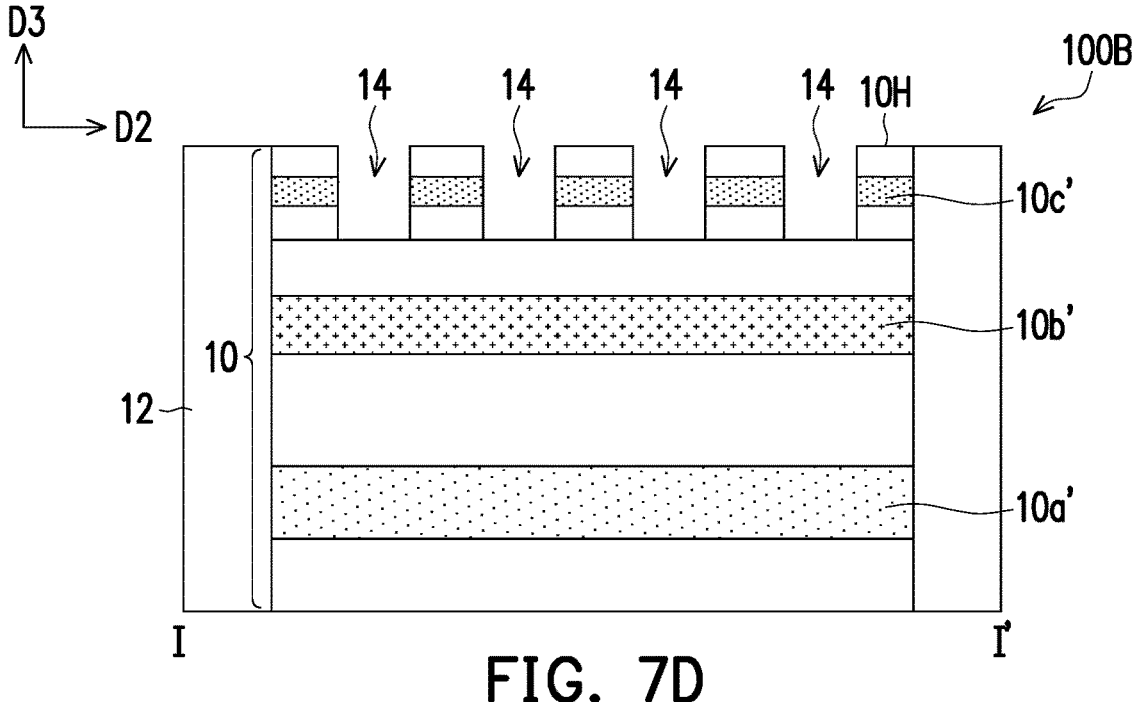
Figure 7E:
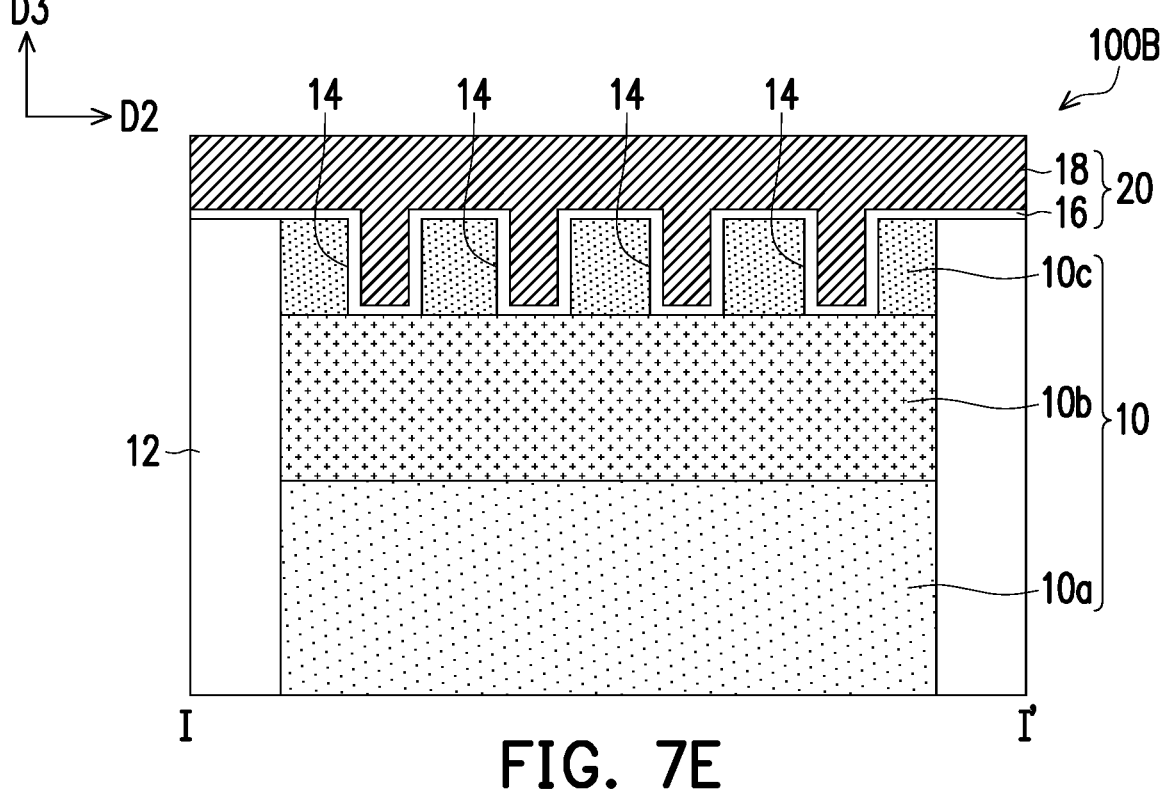

Referring to FIG. 7D, the mask layer 50 and the hard mask layer 48 are removed, so as to expose the surface 10H of the substrate 10 and the bottom surfaces 10L of the recesses 14.

Figures 4C, 4D:
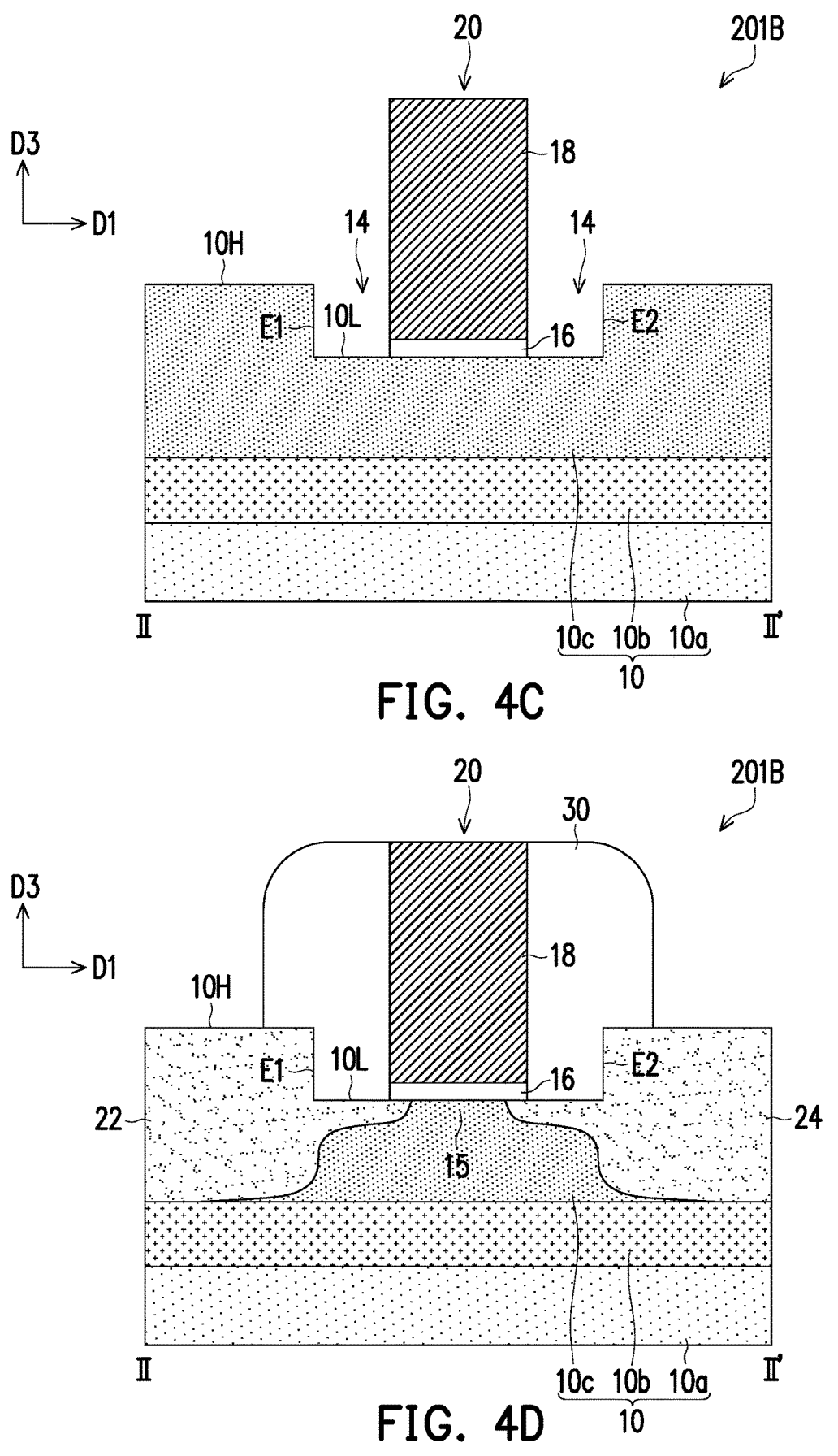
Figures 5A, 5B:
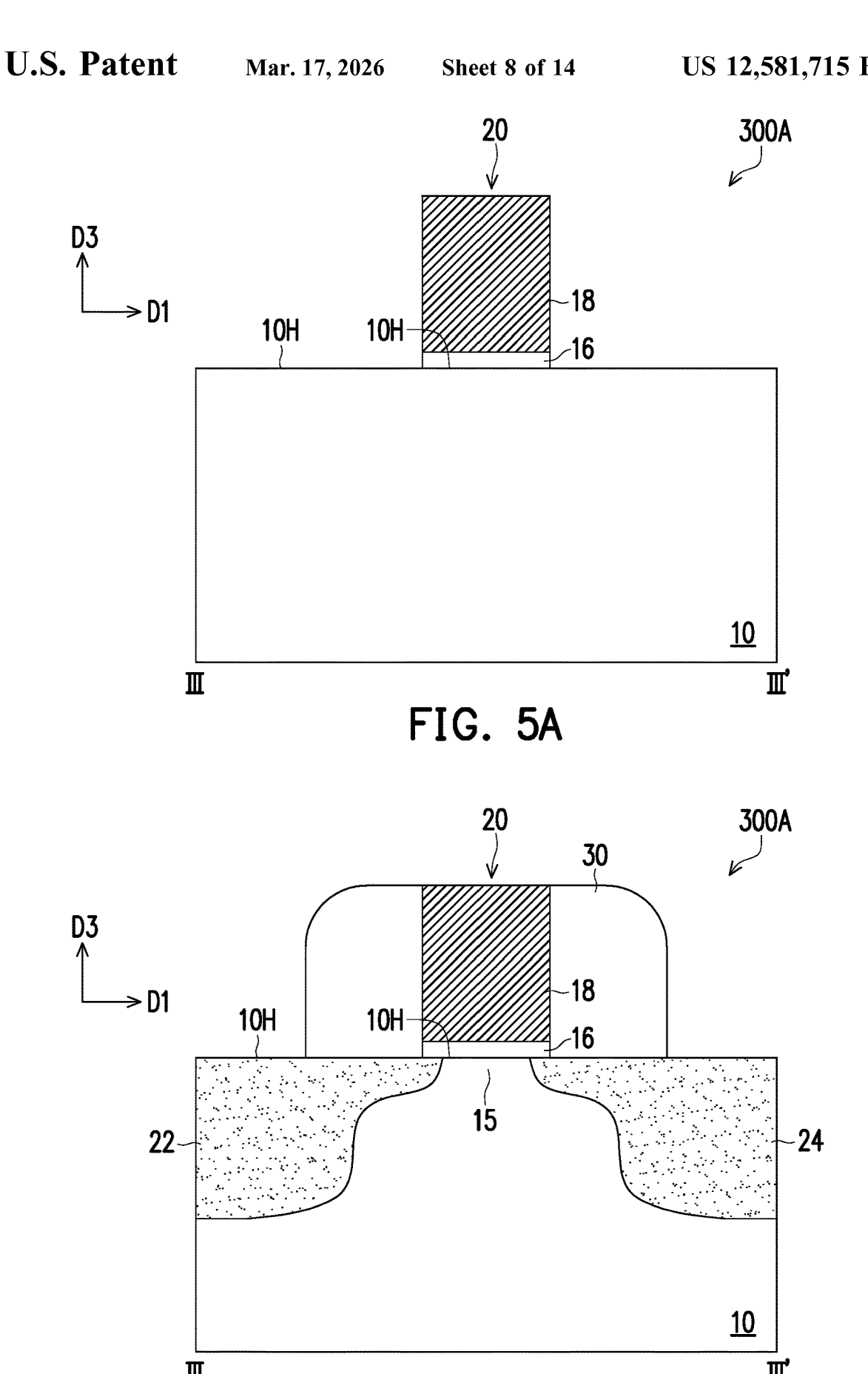
FIG. 5A to FIG. 5D are cross-sectional views of semiconductor devices of some embodiments taken along line III-III' of FIG. 1A or FIG. 2A.
Figures 5C, 5D:
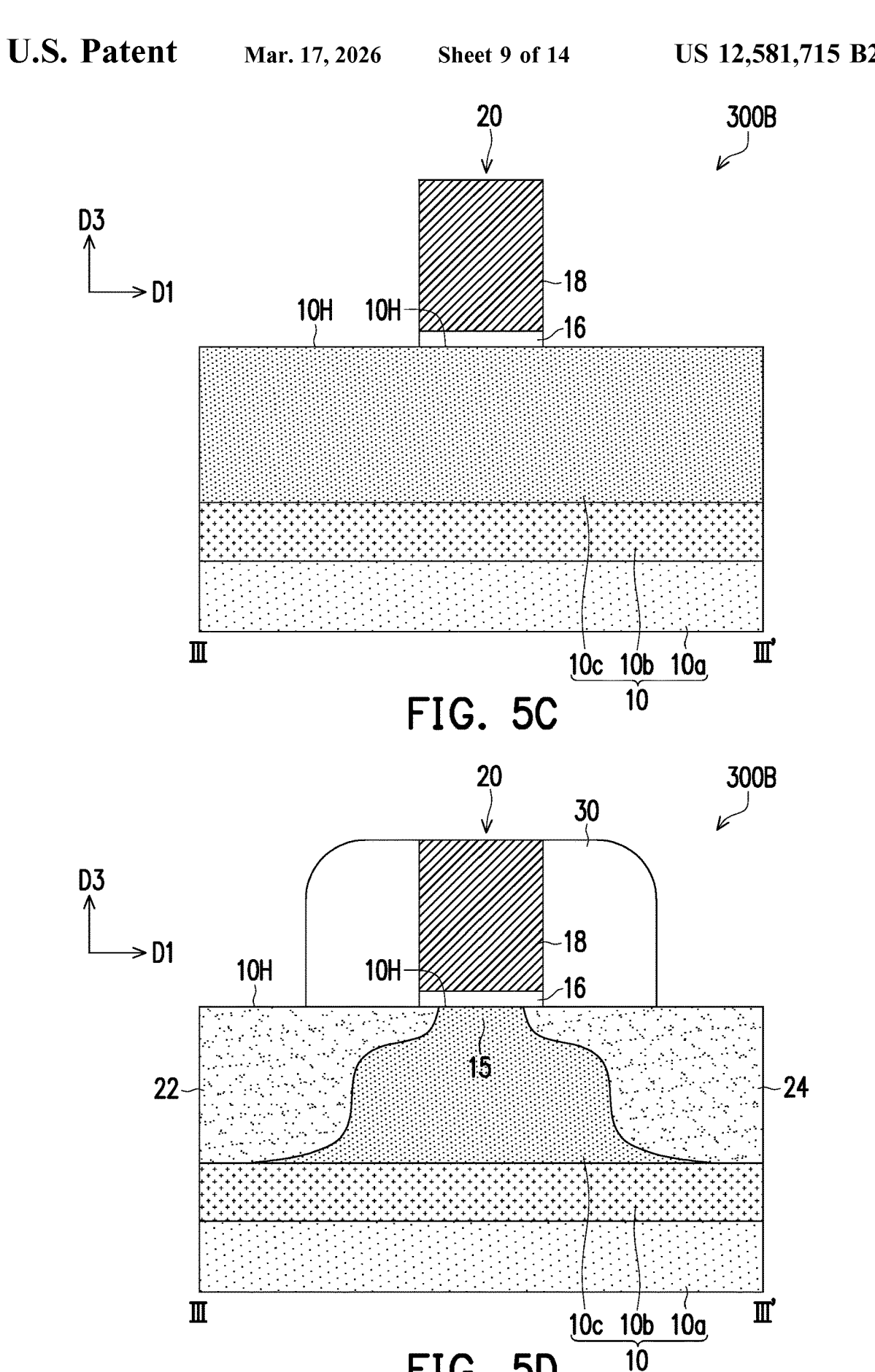

Referring to FIG. 7D, after forming the gate dielectric material and the gate conductive material, an isolation structure 12 is formed in the substrate 10. Afterwards, the lithography and etching processes are performed to pattern the gate dielectric material and the gate conductive material to form a gate dielectric layer 16 and a gate conductive layer 18 of the gate structure 20, as shown in FIG. 3C, FIG. 4C and FIG. 5C.

Afterwards, lightly doped drain regions 22a and 24a, spacers 30, a first doped region 22 and a second doped region 24 are formed according to the method described in the above embodiments, and the dopants in the well region 10a' and the doped regions 10b' and 10c' are activated to form the well region 10a and the doped regions 10b and 10c, as shown in FIG. 3C, FIG. 3D, FIG. 4C, FIG. 4D, FIG. 5C and FIG. 5D.

The semiconductor device of the present disclosure can be applied to not only a high-voltage device, but also a low-voltage device. The transistor of the present disclosure may be an N-type MOS transistor, or a P-type MOS transistor.

The arrangement of multiple recesses in the embodiment of the present disclosure can increase the formation of sidewall channels, so the effective width of the channel can be increased without increasing the width of the gate active region, and the current $I_{on}$-$I_{off}$ of the device can be increased. Therefore, the present disclosure can save the chip area.

Although the disclosure has been disclosed as above with embodiments, they are not intended to limit the disclosure. People with ordinary skills in the art can make some changes and modifications without departing from the spirit of the disclosure, so the scope of the disclosure shall be defined by the following claims.

What is claimed is:

1. A semiconductor device, comprising:
a substrate having a plurality of recesses therein;
a gate structure covering the plurality of recesses and a surface of the substrate between the plurality of recesses, wherein the gate structure comprises:
a gate dielectric layer covering bottom surfaces and sidewalls of the plurality of recesses and the surface of the substrate between the plurality of recesses; and
a gate conductive layer disposed on the gate dielectric layer, filling in the plurality of recesses and covering the surface of the substrate between the plurality of recesses;
a first doped region and a second doped region located at two sides of the gate structure,
wherein a length of the plurality of recesses in a first direction is greater than a length of the gate structure in the first direction; and a plurality of spacers on sidewalls of the gate structure, wherein sidewalls of a plurality of ends of each recess in the first direction and a top surface of the substrate are covered by the corresponding spacers.

2. The semiconductor device of claim 1, further comprising an isolation structure defining an active region of the substrate.

3. The semiconductor device of claim 2, wherein some of the plurality of recesses are in the active region.

4. The semiconductor device of claim 2, wherein some of the plurality of recesses are in the active region and the isolation structure.

5. The semiconductor device of claim 1, wherein the plurality of recesses extend in the first direction which is parallel to a direction of a channel, and the plurality of recesses are arranged in a second direction which is parallel to an extending direction of the gate structure.

6. The semiconductor device of claim 1, wherein the substrate comprises a bulk substrate or a silicon-on-insulator substrate.

7. A method of fabricating a semiconductor device, comprising: forming a plurality of recesses in the substrate;
forming a gate structure on the substrate, wherein the gate structure covers the plurality of recesses and a surface of the substrate between the plurality of recesses, wherein the gate structure comprises:
a gate dielectric layer covering bottom surfaces and sidewalls of the plurality of recesses and the surface of the substrate between the plurality of recesses; and
a gate conductive layer formed on the gate dielectric layer, filling in the plurality of recesses and covering the surface of the substrate between the plurality of recesses;
forming a first doped region and a second doped region at two sides of the gate structure,
wherein a length of the plurality of recesses in a first direction is greater than a length of the gate structure in the first direction; and forming a plurality of spacers on sidewalls of the gate structure, wherein sidewalls of a plurality of ends of each recess in the first direction and a top surface of the substrate are covered by the corresponding spacers.

8. The method of fabricating a semiconductor device of claim 7, further includes forming an isolation structure in the substrate to define an active region.

9. The method of claim 8, wherein the plurality of recesses are formed in the active region.

10. The method of claim 8, wherein the plurality of recesses are formed in the active region and the isolation structure.

11. The method of claim 7, wherein the plurality of recesses extend in the first direction which is parallel to a direction of a channel, and the plurality of recesses are arranged in a second direction which is parallel to an extending direction of the gate structure.

12. The method of claim 7, wherein the substrate comprises a bulk substrate or a silicon-on-insulator substrate.

\* \* \* \* \*